United States Patent [19]

McConica et al.

[11] 4,369,455
[45] Jan. 18, 1983

[54] INK JET PRINTER DRIVE PULSE FOR ELIMINATION OF MULTIPLE INK DROPLET EJECTION

[75] Inventors: Charles H. McConica, Fort Collins; Michael A. Tremblay, Loveland; Pedro F. Engel, Fort Collins, all of Colo.

[73] Assignee: Hewlett-Packard Company, Palo Alto, Calif.

[21] Appl. No.: 214,149

[22] Filed: Dec. 8, 1980

[51] Int. Cl.³ .............................................. G01D 15/16
[52] U.S. Cl. .................................. 346/140 R; 310/317
[58] Field of Search ..................... 346/140 R; 310/317

[56] References Cited

U.S. PATENT DOCUMENTS

| 4,104,646 | 8/1978 | Fischbeck | 346/140 R |
| 4,112,433 | 9/1978 | Vernon | 346/140 R X |
| 4,266,232 | 5/1981 | Juliana | 346/140 R |
| 4,291,316 | 9/1981 | Kakeno | 346/140 R |

Primary Examiner—Joseph W. Hartary
Attorney, Agent, or Firm—Douglas A. Kundrat

[57] ABSTRACT

The electrical drive pulse applied to the piezoelectric crystal of an ink jet printer is designed to cause ejection of a single desired ink droplet from the print head and to preclude ejection of unwanted multiple ink droplets. The drive pulse consists of the superposition of two waveforms wherein the first waveform causes ejection of the desired ink droplet and the superimposed second waveform removes energy from the print head so that mechanical ringing of the ink supply within the print head does not cause ejection of unwanted ink droplets.

4 Claims, 5 Drawing Figures

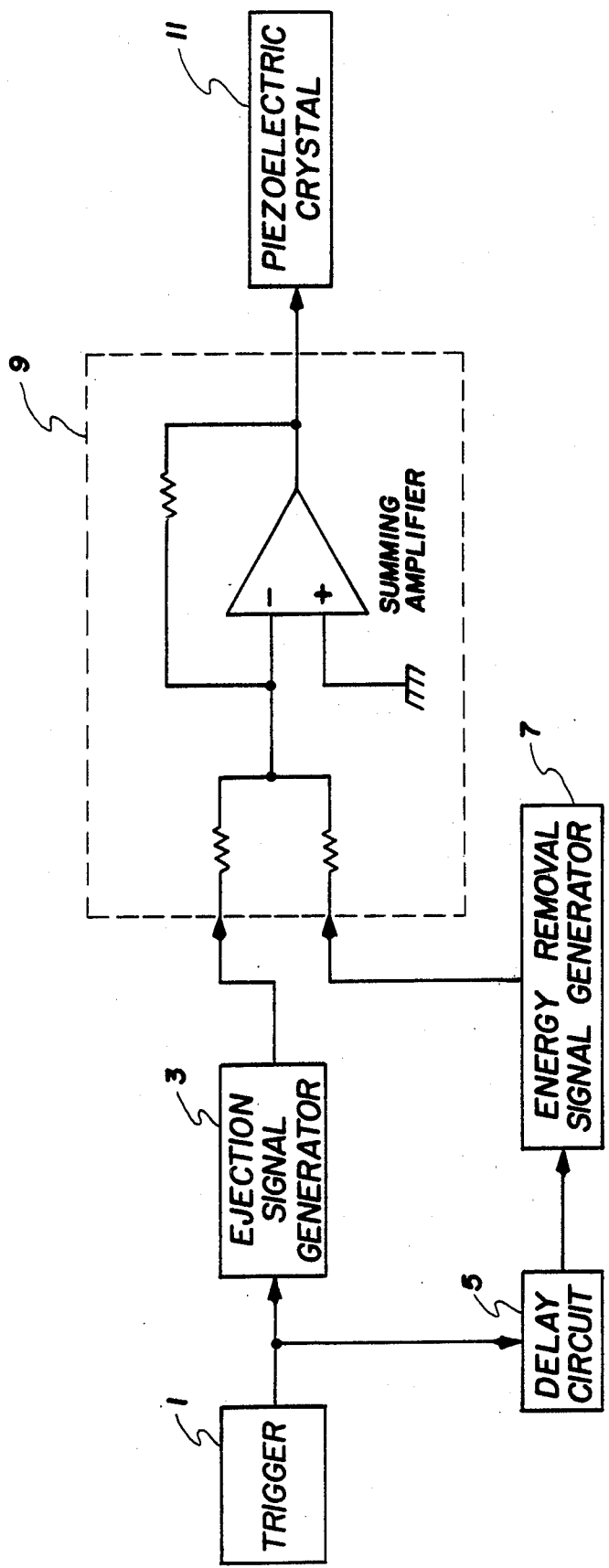

INK JET PRINTER DRIVE PULSE FOR ELIMINATION OF MULTIPLE INK DROPLET EJECTION

BACKGROUND AND SUMMARY OF THE INVENTION

The present invention relates generally to ink jet printers and more specifically to those ink jet printers that utilize a piezoelectric crystal to cause ejection of ink droplets onto a writing surface in response to electrical drive pulses applied to the piezoelectric crystal. Exemplary of such ink jet printers is that described in U.S. Pat. No. 3,747,120, entitled Arrangement of Writing Mechanisms for Writing on Paper with a Colored Liquid. In general, the ink jet printers described in the prior art have failed to limit the number of ink droplets that reach the writing surface in response to each single drive pulse applied to the piezoelectric crystal and this failure have resulted in blurring of the printed information. Limiting to one the number of ink droplets that reach the writing surface in response to each drive pulse is highly desirable in order that the blurring of the printed information may be reduced and the resolution of the printed information may thereby be improved.

Due to the resonant ringing response characteristics of the print head and the ink supply therein, each prior art drive pulse applied to the piezoelectric crystal causes multiple ink droplets to be ejected from the print head. Application of such a prior art drive pulse to the piezoelectric crystal has the immediate effect of causing the piezoelectric crystal to flex into the ink supply within the print head, thereby ejecting the desired droplet of ink. But, the flexing motion of the piezoelectric crystal also causes the ink supply within the print head to ring mechanically for a period of time following the ejection of the desired ink droplet. This resonant ringing motion of the ink within the print head results in the ejection of undesired additional ink droplets from the print head.

U.S. Pat. No. 4,106,032, entitled Apparatus for Applying Liquid Droplets to a Surface by Using a High Speed Laminar Air Flow to Accelerate the Same, describes a prior art attempt to restrict to one the number of ink droplets which reach the writing surface in response to a single drive pulse. This solution attempts to coalesce the multiple ink droplets ejected from the print head into a single droplet before they reach the writing surface by accelerating the ink droplets with a high speed laminar air flow. Tests indicate that, in general, the laminar air flow fails to cause the droplets to coalesce together with the result that the ink droplets reach the writing surface separately, thereby causing blurring of the printed information.

In contrast, the present invention is directed to a circuit for generating an electrical drive pulse which is shaped so as to cause only a single ink droplet to be ejected from the print head in response to each single drive pulse. Since only a single ink droplet is ejected from the print head, only a single ink droplet reaches the writing surface and blurring of the printed information is reduced.

The electrical drive pulse is formed as the composite of two separate electrical waveforms. The first is shaped to cause the piezoelectric crystal to flex in a manner causing the desired ink droplet to be ejected from the print head. The second waveform is shaped to cause the piezoelectric crystal to flex in a motion opposite to the ringing motion of the ink supply within the print head. The effect of the composite waveform on the piezoelectric crystal is twofold. First, a single ink droplet is ejected from the print head. And second, the ringing motion of the ink supply within the print head is suppressed with the result that additional ink droplets are not ejected from the print head.

BRIEF DESCRIPTION OF THE DRAWINGS

FIG. 1 is a block diagram of a preferred embodiment of the present invention.

FIG. 2 is a block diagram of another embodiment of the present invention employing digital techniques.

DESCRIPTION OF THE PREFERRED EMBODIMENT

Figure 3A:
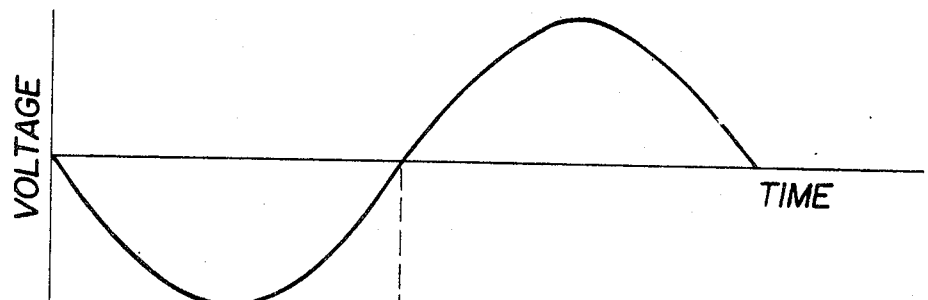
FIGS. 3A-C illustrate an ejection component waveform, an energy removal component waveform, and the resultant composite drive pulse waveform, respectively, as generated by the circuitry of FIGS. 1 and 2.

Referring now to FIG. 1 there is shown a block diagram of a preferred embodiment of the present invention. Operation of this preferred embodiment of the invention may be understood with additional referene to FIGS. 3A-C. A trigger signal generator 1, which may comprise a pulse generator such as a Model 3310B signal generator manufactured by Hewlett-Packard Company, generates a trigger signal whenever ejection of an ink droplet is desired. This trigger signal is coupled to a trigger input of an ejection signal generator 3, which may comprise a triggerable function generator such as a Hewlett-Packard Model 3310B signal generator, and causes generation thereby of the ejection signal depicted in FIG. 3A. The trigger signal is also coupled through a delay circuit 5 to a trigger input of an energy removal signal generator 7, which may comprise another triggerable function generator such as a Hewlett-Packard Model 3310B signal generator. The delay circuit 5 functions to delay the trigger signal a preselected amount of time and may comprise any of a number of off-the-shelf components such as an LS74122 one-shot manufactured by Texas Instruments, Inc. In response to the delayed trigger signal, the energy removal signal generator 7 generates an energy removal signal, depicted in FIG. 3B. Both the ejection signal and the energy removal signal are coupled to individual signal inputs of a summing amplifier 9, which may comprise a well-known type of operational amplifier circuit using resistive feedback and having two resistive signal inputs. The output of the summing amplifier 9, which is composed of the superposition of the energy removal signal and the ejection signal and is depicted in FIG. 3C as the drive pulse, is coupled to the piezoelectric crystal 11.

Figure 3B:
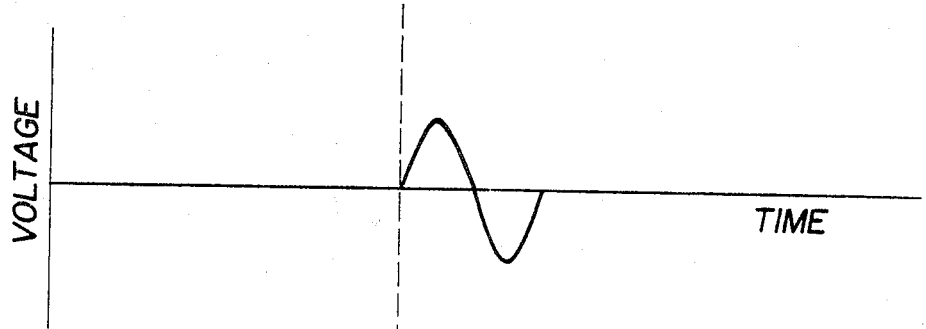
Figure 3C:
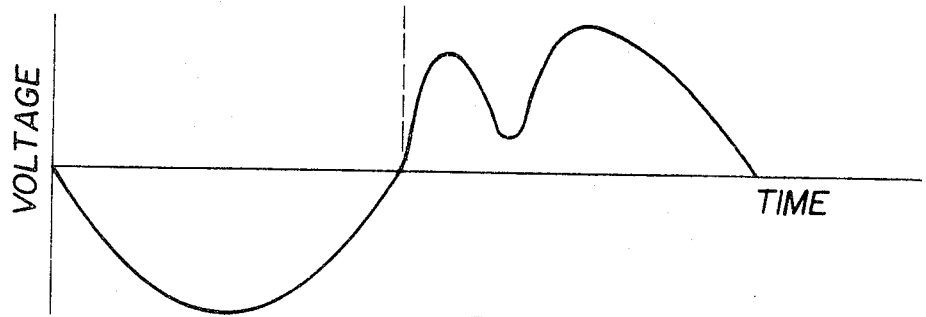

The ejection signal, depicted in FIG. 3A, consists of a single cycle of a negative sine wave, $V = -\sin(\omega t)$, having an amplitude sufficient to cause ejection of a single ink droplet from the print head and a frequency compatible with the overall printing speed requirements of the ink jet printer. The energy removal signal, depicted in FIG. 3B, consists of a single cycle of a sine wave having a frequency equal to the resonant frequency of the print head and an amplitude chosen to minimize the resonant ringing motion of the ink within the print head. The time delay introduced by delay circuit 5 is selected so that the motion of the piezoelectric crystal caused by the energy removal signal and the resonant ringing motion of the ink within the print head differs in phase to the degree required to sufficiently suppress the resonant ringing motion of the ink so that multiple ejection of ink droplets is eliminated. In theory a phase difference of 180 degrees is optimum for this purpose, but tests have shown that in practice the optimum phase difference will be between 135 and 225 degrees. This deviation in phase difference from the 180 degree theoretical optimum may be used to compensate for a difference in frequency of the energy removal signal and the actual resonant frequency of the print head caused by measurement error or changes in ink composition or ambient temperature.

Referring now to FIG. 2 there is shown a block diagram of another embodiment of the present invention employing digital techniques. Whenever ejection of an ink droplet is desired, trigger 1 generates a trigger signal which is coupled to a trigger input of a memory circuit 13. Stored within the memory circuit 13, which may comprise a programmable read-only memory (PROM) such as the Harris Semiconductor Corp. type 7603, is a digital representation of the drive pulse depicted in FIG. 3C. The trigger signal causes this digital representation to be coupled from the memory circuit 13 to the digital-to-analog converter 15, which may comprise a National Semiconductor Corp. type DAC-08 circuit, wherein the digital representation is converted to the analog composite drive pulse which is depicted in FIG. 3C. The drive pulse is then coupled to the print head piezoelectric crystal 11 and causes a single ink droplet to be ejected from the print head while precluding ejection of additional unwanted ink droplets.

We claim:

1. An apparatus for generating a drive signal for application to a piezoelectric crystal of an ink jet print head, the apparatus comprising:

trigger means for generating a trigger signal at an output;

first generation means, having an input connected to the trigger means output and being responsive to presence of the trigger signal thereat, said first generation means being operative for presenting at an output a first signal which is composed of a single cycle sinusoidal wave;

delay means, having an input connected to the trigger means output, for receiving the trigger signal at the input and for presenting said trigger signal at an output a delay period of time thereafter;

second generation means, having an input connected to the delay means output, for presenting a second signal at an output in response to presence of the trigger signal at the input; and summing means, having a first input connected to the first generation means output and a second input connected to the second generation means output, said summing means being operative for presenting at an output a drive signal which is composed of a sum of the signals present at the first and second inputs.

2. An apparatus as in claim 1, wherein the first signal is composed of a single cycle negative sine wave of the form $-\sin(\omega t)$.

3. An apparatus as in claim 1 or 2, wherein:

the second signal comprises a sinusoidal wave having a frequency which is approximately equal to a resonant frequency of the ink jet print head; and the delay period is preselected so that a delay phase difference between the second signal and a signal representing an ink jet print head resonant ringing response to an application of the first signal to the piezoelectric crystal is approximately 180 degrees.

4. An apparatus as in claim 3, wherein the delay period is preselected so that the delay phase difference is between 135 and 225 degrees.

* * * * *

UNITED STATES PATENT AND TRADEMARK OFFICE
CERTIFICATE OF CORRECTION

PATENT NO. : 4,369,455
DATED : January 18, 1983
INVENTOR(S) : Charles H. McConica et al It is certified that error appears in the above—identified patent and that said Letters Patent is hereby corrected as shown below:

Column 1, line 20, "have" should be --has--.

Signed and Sealed this

Twenty-first Day of June 1983

[SEAL]

Attest:

DONALD J. QUIGG

Attesting Officer     Acting Commissioner of Patents and Trademarks